United States Patent [19]

Chihara et al.

[11] Patent Number: 5,256,209
[45] Date of Patent: Oct. 26, 1993

[54] METHOD FOR CLEANING ROSIN-BASE SOLDER FLUX

[75] Inventors: Machio Chihara, Nara; Jiro Mizuya, Osaka; Tatsuya Okumura, Osaka; Takashi Tanaka, Osaka, all of Japan

[73] Assignee: Arakawa Chemical Industries, Ltd., Osaka, Japan

[21] Appl. No.: 720,148

[22] Filed: Jun. 24, 1991

[30] Foreign Application Priority Data

Jun. 27, 1990 [JP] Japan .................. 2-170657

[51] Int. Cl.$^5$ ................................ B08B 3/08
[52] U.S. Cl. .............................. 134/38; 134/40
[58] Field of Search ............... 252/174.22, 174.16; 134/38, 40

[56] References Cited

U.S. PATENT DOCUMENTS

| | | | |
|---|---|---|---|
| 4,369,134 | 1/1983 | Deguchi et al. | 252/526 |
| 4,493,782 | 1/1985 | Williamson | 252/90 |
| 4,640,719 | 2/1987 | Hayes et al. | 134/40 |
| 4,983,224 | 1/1991 | Mombun et al. | 134/40 |

FOREIGN PATENT DOCUMENTS

| | | | |
|---|---|---|---|
| 0224167 | 6/1987 | European Pat. Off. . | |
| 294574 | 12/1988 | European Pat. Off. | 252/174.21 |
| 0426943 | 5/1991 | European Pat. Off. . | |
| 858485 | 12/1952 | Fed. Rep. of Germany . | |

OTHER PUBLICATIONS

Ameen et al. *Rosin Flux Solvent;* IBM Technical Disclosure Bulletin vol. 15 #8 Jan. 1973.

*Primary Examiner*—Michael Lewis
*Assistant Examiner*—Stuart L. Hendrikson
*Attorney, Agent, or Firm*—Armstrong, Westerman, Hattori, McLeland & Naughton

[57] ABSTRACT

The invention provides a cleaning method for removing a rosin-base solder flux, using essentially a mixture of (A) a compound of the formula (1)

$$R^1O-(CH_2CHO)_k-R^2 \atop | \atop R^3 \qquad (1)$$

wherein $R^1$ is a hydrogen atom or an alkyl group having 1 to 5 carbon atoms, $R^2$ is an alkyl group having 1 to 5 carbon atoms, $R^3$ is a hydrogen atom or a methyl group and k is an integer of 2 to 4, (B) a compound represented by the formula (2)

$$R^4-O-(CH_2CH_2O)_m-H \qquad (2)$$

wherein $R^4$ is a straight- or branched-chain alkyl group having 6 to 20 carbon atoms, phenyl group or a phenyl group substituted with a straight- or branched-chain alkyl group having 7 to 12 carbon atoms and m is an integer 2 to 20, (C) a compound represented by the formula (3)

$$R^5-O-(CH_2CH_2O)_n-\overset{\overset{O}{\|}}{\underset{X}{P}}-OH \qquad (3)$$

wherein $R^5$ is a straight- or branched-chain alkyl group having 5 to 20 carbon atoms, phenyl group, or a phenyl group substituted with a straight- or branched-chain alkyl group having 7 to 12 carbon atoms, n is an integer of 0 to 20 and X is a hydroxyl group or a group represented by the formula (4)

$$R^6O(CH_2CH_2O)_n- \qquad (4)$$

wherein $R^6$ is defined the same as $R^5$ and n is as defined above, or a salt thereof.

10 Claims, No Drawings

METHOD FOR CLEANING ROSIN-BASE SOLDER FLUX

The present invention relates to a cleaning agent and method for removal of rosin-base solder fluxes and more particularly to a cleaning agent and method for removal of rosin-base solder fluxes for assembly.

A rosin-base solder flux is used in production of modules for printed circuit boards, printed wiring boards or the like. Generally soldering is conducted to promote the union between the substrate and pins and to prevent oxidation in contact points which impairs electrical conductivity. Rosin-base fluxes are employed to accomplish the soldering as desired. After soldering, a cleaning agent is used to remove only the flux selectively and completely. When the cleaning agent fails to completely remove the flux, the remaining flux adversely affects the soldering, giving disadvantages of circuit corrosion, reduction of electrical insulating properties on board surfaces and eventual breakdown of circuits. To eliminate such potential disadvantages, the residual flux, particularly the activator present therein, is usually removed by a proper cleaning agent.

Halogenated hydrocarbon solvents such as trichloroethylene, trichlorotrifluoroethane and like flons have been heretofore used as cleaning agents for removal of rosin-base fluxes. However, stringent regulations for control of such halogenated hydrocarbon solvents have been laid down to solve or alleviate the environmental pollution problems such as the depletion of ozone layer. Currently there is an urgent demand from the electric machine industry for development of cleaning agents for fluxes as a substitute for flons.

In recent years, various halogen-free cleaning agents for fluxes have been developed. For example, alkali saponification type cleaning agent has been proposed. Such cleaning agent, which is in the form of an aqueous solution, does not have a problem of being inflammable, but has the drawback of having a low cleaning efficiency such that the board should be contacted with the solution for a long period of time with heating, and there is a danger that the metal parts of the board may be corroded. On the other hand, non-alkali saponification type cleaning agents have also been proposed. However, no cleaning agent has been provided which can completely fulfill all property requirements for cleaning agents including cleaning property, toxicity, odor, inflammability, etc.

For this reason, we conducted an intensive research in an attempt to solve the foregoing problems and consequently found that when a specific glycol ether compound and a nonionic surfactant is conjointly used as the essential ingredients, the foregoing problems can be solved. Based on this finding, we accomplished the invention described in Japanese Patent Application No. Hei 1-291905.

If the cleaning properties of a cleaning agent for removing solder fluxes is substantially retained when the cleaning agent is diluted with water, such diluted cleaning agent in the form of an aqueous solution or emulsion has the advantages of being less inflammable, being inexpensive and considerably reducing the load of waste water treatment. The specification of the above Japanese patent application discloses that the cleaning agent described therein can be used as diluted with water. However, there is a tendency that the cleaning ability of said cleaning agent is reduced when it is used as diluted with water.

It is an object of the present invention to provide a halogen-free cleaning agent for removal of solder fluxes which has an excellent cleaning property, especially when used as diluted with water, and which is substantially satisfactory in characteristics meeting the environmental quality standard, odor, inflammability, etc.

We conducted extensive research to achieve the foregoing object and found that a cleaning agent comprising as active ingredients a specific glycol ether compound, a nonionic surfactant and a phosphate anionic surfactant surprisingly is free of all the above-mentioned problems. We have accomplished the present invention based on this novel finding.

According to the present invention, there is provided a cleaning agent for removal of a rosin-base solder flux, the cleaning agent comprising a mixture of
(A) at least one glycol ether compound represented by the formula (1)

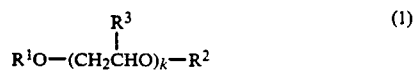

wherein $R^1$ is a hydrogen atom or an alkyl group having 1 to 5 carbon atoms, $R^2$ is an alkyl group having 1 to 5 carbon atoms, $R^3$ is a hydrogen atom or a methyl group and k is an integer of 2 to 4,
(B) a nonionic surfactant, and
(C) a phosphate anionic surfactant.

The present invention also provides a cleaning method for removing a rosin base flux, the method comprising bringing the above cleaning agent into contact with the rosin-base flux.

Examples of the glycol ether compounds of the formula (1), i.e., Component (A) of the cleaning agent for the rosin-base solder flux of the invention, are diethylene glycol monomethyl ether, diethylene glycol dimethyl ether, diethylene glycol monoethyl ether, diethylene glycol diethyl ether, diethylene glycol methyl ethyl ether, diethylene glycol monopropyl ether, diethylene glycol dipropyl ether, diethylene glycol methyl propyl ether, diethylene glycol ethyl propyl ether, diethylene glycol monobutyl ether, diethylene glycol dibutyl ether, diethylene glycol methyl butyl ether, diethylene glycol ethyl butyl ether, diethylene glycol propyl butyl ether, diethylene glycol monopentyl ether, diethylene glycol dipentyl ether, diethylene glycol methyl pentyl ether, diethylene glycol ethyl pentyl ether, diethylene glycol propyl pentyl ether, diethylene glycol butyl pentyl ether; the corresponding tri- or tetraethylene glycol ethers; and the corresponding di-, tri- or tetrapropylene glycol ethers, etc. These compounds are usable singly or at least two of them can be used in a suitable combination.

The nonionic surfactant, i.e., Component (B) of the cleaning agent for rosin-base solder flux of the invention, can be selected without particular limitation from various known surfactants in so far as it has nonionic characters. Typical examples thereof are polyoxyethylene alkyl ether wherein the alkyl group has at least 6, particularly 6-22, carbon atoms, polyoxyethylene phenyl ether, polyoxyethylene alkylphenyl ether and like polyethylene glycol ether based nonionic surfactants; polyethylene glycol monoester, polyethylene glycol diester and like polyethylene glycol ester-based nonionic surfactants; adducts of ethylene oxide and higher aliphatic amine; adducts of ethylene oxide and fatty acid amide; sorbitan fatty acid ester, sugar fatty acid ester and like polyhydric alcohol-based nonionic surfactants; fatty acid alkanol amide; the corresponding polyoxypropylene-based nonionic surfactants; and polyoxyethylene-polyoxypropylene copolymer-based nonionic surfactants. These nonionic surfactants are usable singly or at least two of them can be used in combination.

Among the above-exemplified surfactants, polyethylene glycol ether based nonionic surfactants are desirable in view of the cleaning property of the cleaning agent, and more preferable are surfactants represented by the following formula (2)

wherein $R^4$ is a straight- or branched-chain alkyl group having 6 to 20 carbon atoms, preferably 10 to 14 carbon atoms, phenyl group, or a phenyl group substituted with a straight- or branched-chain alkyl group having 7 to 12 carbon atoms and m is an integer of 2 to 20, preferably 3 to 16.

As the phosphate anionic surfactant, i.e., Component (C) of the invention, various known phosphate anionic surfactants can be used without particular limitation. Preferable examples thereof are surfactants represented by the following formula (3)

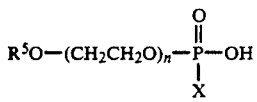

wherein $R^5$ is a straight- or branched-chain alkyl group having 5 to 20 carbon atoms, phenyl group, or a phenyl group substituted with a straight-or branched-chain alkyl group having 7 to 12 carbon atoms, n is an integer of 0 to 20, preferably 3 to 16 and X is a hydroxyl group or a group represented by the formula (4)

wherein $R^6$ is a straight- or branched-chain alkyl group having 5 to 20 carbon atoms, phenyl group, or a phenyl group substituted with a straight- or branched-chain alkyl group having 7 to 12 carbon atoms and n is as defined above, or salts thereof. Examples of such salts are metal salts such as sodium salt and potassium salt, ammonium salts, alkanolamine salts such as monoethanolamine salt, diethanolamine salt or triethanolamine salt and the like.

Particularly preferred phosphate anionic surfactants are polyoxyalkylene phosphate surfactants of the formula (3) wherein $R^5$ is a straight- or branched-chain alkyl group having 10 to 15 carbon atoms, n is an integer of 8 to 12 and X is a hydroxyl group or a group of the formula (4)

wherein $R^6$ is a straight- or branched chain alkyl group having 10 to 15 carbon atoms and n is an integer of 8 to 12.

The polyoxyalkylene phosphate surfactants represented by the formula (3) and the salts thereof are widely marketed, for example, under the tradenames of "PLYSURF" series (products of Dai-ichi Kogyo Seiyaku Co., Ltd.), "N-1000FCP", "RA-574" and "RA-579" (products of Nihon Nyukazai Kabushiki Kaisha) and the like.

There is no specific restriction on the proportions of said glycol ether compound (A), nonionic surfactant (B) and phosphate anionic surfactant (C). The cleaning agent of the invention preferably contains a mixture comprising:
about 10 to about 95 wt. % of Component (A),
about 5 to about 90 wt. % of Component (B), and
about 0.1 to about 90 wt. % of Component (C) and
more preferably contains a mixture comprising:
about 50 to about 90 wt. % Of Component (A),
about 10 to about 60 wt. % of Component (B), and
about 0.5 to about 60 wt. % of Component (C).

In each case, the total of Component (A), Component (B) and Component (C) must add up to 100 wt.%.

When required, the cleaning agent of the invention may contain additives such as defoaming agent, antioxidizing agent or the like. Such additive, if used, is added in an amount of about 0.1 wt. % or less based on the weight of the cleaning agent of the invention.

The cleaning agent of the invention comprising the glycol ether compound (A), the nonionic surfactant (B) and the phosphate anionic surfactant (C) is used for removing rosin-base fluxes, particularly those for assembly. Fluxes to be removed by the cleaning agent of the invention include inactive rosin fluxes consisting essentially of rosin, modified rosin or like rosin compound, and active rosin fluxes consisting essentially of such rosin compound and an activator (e.g. organic or inorganic acid salts of amine compounds such as triethanolamine hydrochloride, triethylene-tetramine hydrochloride, cyclohexylamine hydrochloride, aniline hydrochloride, etc.). Significant effect is produced by the cleaning agent of the invention especially when it is used for removing active fluxes for assembly.

The cleaning agent of the invention can be brought into contact with the rosin base flux on a substrate such as printed circuit board and the like by the following methods. The cleaning agent of the invention consisting of the active ingredients, i.e., a mixture of the glycol ether compound (A), the nonionic surfactant (B) and the phosphate anionic surfactant (C) is used as it is, or used in the form of an aqueous solution having a concentration of the mixture of the active ingredients in the range of about 10% by weight or more but less than 100% by weight, preferably about 70% by weight or more but less than 100% by weight. The substrate may be directly immersed in the thus obtained aqueous solution or in the active ingredients per se. Alternatively the aqueous solution may be sprayed over the substrate to flush it therewith, or the active ingredients per se or the aqueous solution may be brought into contact with the rosin-base flux on brushing by mechanical means. A suitable method is selected from these methods.

The cleaning agent of the invention is applied under the conditions suitably determined according to the concentration of the active ingredients in the cleaning agent to be used, the proportions of the active ingredients, the kind of a flux to be removed, and the like. Usually the cleaning agent of the invention is brought into contact with a flux ar a temperature and for a period of time effective to remove the flux. The temperature for cleaning is usually in the range of from room temperature to about 80° C., and is preferably between about 50° C. and about 70° C. For removal of a flux on a substrate by the immersion method at a temperature of e.g. about 60° C., the substrate bearing a flux is usually immersed in the cleaning agent of the invention for about 1 to about 5 minutes, whereby the flux can be eliminated effectively.

Following the cleaning operation, the substrate is then washed with water as a finishing step, whereby the cleaning agent possibly remaining on the substrate is completely washed away. Such rinsing leads to high level of cleanness.

Such rinsing can be carried out in various ways, such as, by dipping in running water, dipping in water under application of ultrasonic wave, spraying with water or the like. Rinsing is conducted at a temperature and for a period of time effective to remove the cleaning agent and to thereby achieve a high degree of cleanness. The rinsing is usually conducted at a temperature ranging from room temperature to about 70° C. When the rinsing is conducted by showering or dipping, the time required for completion of the rinsing is usually about 30 seconds to about 5 minutes. In any event, the rinsing is continued until the substrate becomes clean enough for a particular purpose.

The cleaning agent of the invention can exhibit a flux-removing effect higher than or at least as high as conventional halogenated hydrocarbon type cleaning agents and can accomplish a high degree of flux removal.

The present invention can additionally provide the following advantages.

(i) The cleaning agent of the invention is halogen-free and does not pose the ozone depletion problem as caused by flon-type cleaning agents.

(ii) The cleaning agent of the invention, containing the glycol ether compound of the formula (1), is slightly inflammable in the absence of water. However, an explosion-proof cleaning apparatus specially designed is not required and commercially available conventional cleaning apparatus for flons is useful as it is or as slightly modified because the glycol ether compound has a flash point of about 70° C. and is classified as "a petroleum of the third kind" stipulated by the Japanese Fire Services Act.

(iii) The cleaning agent of the invention, when used as diluted with water, can achieve the advantages, for example, of reducing the danger of inflammation, rendering the agent less expensive and considerably reducing the load of waste water treatment while retaining sufficient cleaning ability.

(iv) The cleaning agent of the invention emits very low degree of odor, hence satisfactory in this regard as well.

According to the invention, there are provided a halogen-free solder flux-cleaning agent outstanding in a cleaning property and fully satisfactory in properties meeting environmental quality standard in respect of environmental disruption, inflammability, odor, etc. as well as a cleaning method using the solder flux-cleaning agent.

The present invention will be described below in more detail with reference to the following examples to which the scope of the invention is not limited.

EXAMPLE 1

A cleaning agent of the invention was prepared by admixing 68 parts by weight of diethylene glycol dimethyl ether and 10.8 parts by weight of polyethylene glycol alkyl ether nonionic surfactant (trade name "NOIGEN ET-135", a surfactant of the formula (2) wherein $R^4$ is a branched chain alkyl group having 12 to 14 carbon atoms and m is 9, product of Dai-ichi Kogyo Seiyaku Co., Ltd.), 1.2 parts by weight of mono(polyoxyethylene alkyl ether)phosphate (a) (a surfactant of the formula (3) wherein $R^5$ is a $C_{12}$ straight-chain alkyl group, n is 16 and X is a hydroxyl group) and 20 parts by weight or pure water.

A rosin-base flux (trade name "Resin Flux #77-25", product of LONCO Co., Ltd.) was applied to the entire surface of a fine-pattern printed circuit board prepared from a copper-clad laminate and dried at 130° C. for 2 minutes and the board was subjected to soldering at 260° C. for 5 seconds to produce a test board.

The test board was immersed in the foregoing cleaning agent at room temperature for 1 minute and the degree of removal of the flux was inspected with the unaided eye and evaluated according to the following criteria. Table 1 shows the results.

A : The flux was removed to a satisfactory extent.
B : A little quantity of the flux remained unremoved.
C : A considerable quantity of the flux remained unremoved.

Subsequently, the test board was washed with showering water and dried, and the cleanness (concentration of the residual ions) of the test board was determined according to MIL P 28809 with use of an Omegameter 600 SE (trade name for a product of KENKO Co., Ltd.). Table 1 shows the results.

EXAMPLES 2 to 8 and COMPARATIVE EXAMPLE 1

The degree of removal of flux and the cleanness of the test board were evaluated in the same manner as in Example 1 with the exception of changing the composition of the cleaning agent or the cleaning temperature as shown in Table 1. Table 1 shows the results.

EXAMPLES 9 to 19 and COMPARATIVE EXAMPLE 2

The degree of removal of flux and the cleanness of the test board were evaluated in the same manner as in Example 1 with the exception of changing the kind of surfactant(s) as shown in Table 1.

In Table 1, the surfactants used are as follows.

"NOIGEN EA-120", (product of Dai-ichi Kogyo Seiyaku Co., Ltd., polyethylene glycol nonylphenyl ether nonionic surfactant, a surfactant of the formula (2) wherein $R^4$ is a nonylphenyl group and m is 5)

"NOIGEN EA-143" (product of Dai-ichi Kogyo Seiyaku Co., Ltd., polyethylene glycol dodecylphenyl ether nonionic surfactant, a surfactant of the formula (2) wherein $R^4$ is a dodecylphenyl group and m is 10)

"SORGEN TW20" (product of Dai-ichi Kogyo Seiyaku Co., Ltd., polyoxyethylenesorbitan monolaurate, the average number of moles of ethylene oxide added is 12)

"EPAN420" (product of Dai-ichi Kogyo Seiyaku Co., Ltd., polyoxyethylene-polyoxypropylene block copolymer)

(a): Mono(polyoxyethylene alkyl ether)phosphate (a surfactant of the formula (3) wherein $R^5$ is a $C_{12}$ straight-chain alkyl group, n is 16 and X is a hydroxyl group)

(b): Di(polyoxyethylene aralkyl ether)phosphate (a surfactant of the formula (3) wherein $R^5$ is a nonylphenyl group, n is 10 and X is $C_9H_{19}$—$C_6H_4$—$O(CH_2CH_2O)_{10}$—)

(c): Mono(polyoxyethylene aralkyl ether)phosphate (a surfactant of the formula (3) wherein $R^5$ is a nonylphenyl group, n is 18 and X is a hydroxyl group)

(d): Mono(polyoxyethylene alkyl ether)phosphate ammonium salt (a surfactant of the formula (3) wherein $R^5$ is a dodecyl group, n is 14 and X is a hydroxyl group and wherein the two hydroxyl groups thereof are neutralized with ammonia)

(e) Mono(polyoxyethylene alkyl ether)phosphate sodium salt (a surfactant of the formula (3) wherein $R^5$ is a dodecyl group, n is 14 and X is a hydroxyl group and wherein the two hydroxyl groups thereof are neutralized with sodium hydroxide)

(f): Lauryl phosphate branched-chain alkyl group having 7 to 12 carbon atoms and m is an integer 2 to 20, and (C) at least one phosphate anionic surfactant represented by the formula (3)

$$R^5-O-(CH_2CH_2O)_n-\overset{\overset{\displaystyle O}{\|}}{\underset{\underset{\displaystyle X}{|}}{P}}-OH \quad (3)$$

wherein $R^5$ is a straight- or branched-chain alkyl group having 5 to 20 carbon atoms, phenyl group, or a phenyl group substituted with a straight- or branched-chain alkyl group having 7 to 12 carbon

TABLE 1

| | Component (A) | Component (B) | Component (C) | Cleaning agent composition (A)/(B)/(C)/water (wt. %) | Cleaning temp. (°C.) | Degree of Removal | Degree of cleanness Contamination of equivalent NaCl (μg/inch²) |
|---|---|---|---|---|---|---|---|
| Ex. 1 | DEGDME | NOIGEN ET-135 | (a) | 59.5/9.45/1.05/30 | Room temp. | A | 6.8 |
| Ex. 2 | DEGDME | NOIGEN ET-135 | (a) | 59.5/9.45/1.05/30 | 50 | A | 3.7 |
| Ex. 3 | DEGDME | NOIGEN ET-135 | (a) | 49/17.5/3.5/30 | 50 | A | 3.3 |
| Ex. 4 | DEGDME | NOIGEN ET-135 | (a) | 33.95/33.95/2.1/30 | 50 | A | 4.4 |
| Ex. 5 | DEGDME | NOIGEN ET-135 | (a) | 28/21/21/30 | 50 | A | 6.5 |
| Ex. 6 | DEGDME | NOIGEN ET-135 | (a) | 42.5/6.75/0.75/50 | 50 | A | 8.8 |
| Ex. 7 | DEGDME | NOIGEN ET-135 | (a) | 85/13.5/1.5/0 | 50 | A | 3.1 |
| Ex. 8 | DEGDME | NOIGEN ET-135 | (a) | 21/14/35/30 | 50 | A | 6.5 |
| Ex. 9 | DEGMBE | NOIGEN ET-135 | (a) | 59.5/9.45/1.05/30 | 50 | A | 3.8 |
| Ex. 10 | DEGDEE | NOIGEN EA-120 | (a) | 59.5/9.45/1.05/30 | 50 | A | 4.1 |
| Ex. 11 | DEGDME | NOIGEN EA-120 | (a) | 59.5/9.45/1.05/30 | 50 | A | 5.3 |
| Ex. 12 | DEGDME | NOIGEN EA-143 | (a) | 59.5/9.45/1.05/30 | 50 | A | 3.8 |
| Ex. 13 | DEGDME | SORGEN TW20 | (a) | 59.5/9.45/1.05/30 | 50 | A | 4.8 |
| Ex. 14 | DEGDME | EPAN 420 | (a) | 59.5/9.45/1.05/30 | 50 | A | 5.1 |
| Ex. 15 | DEGDME | NOIGEN ET-135 | (b) | 59.5/9.45/1.05/30 | 50 | A | 3.6 |
| Ex. 16 | DEGDME | NOIGEN ET-135 | (c) | 59.5/9.45/1.05/30 | 50 | A | 3.5 |
| Ex. 17 | DEGDME | NOIGEN ET-135 | (d) | 59.5/9.45/1.05/30 | 50 | A | 3.7 |
| Ex. 18 | DEGDME | NOIGEN ET-135 | (e) | 59.5/9.45/1.05/30 | 50 | A | 3.7 |
| Ex. 19 | DEGDME | NOIGEN ET-135 | (f) | 59.5/9.45/1.05/30 | 50 | A | 4.5 |
| Comp. Ex. 1 | DEGDME | NOIGEN ET-135 | None | 49/21/0/30 | 50 | B | 10.8 |
| Comp. Ex. 2 | DEGDME | NOIGEN EA-120 | None | 49/21/0/30 | 50 | B | 11.5 |

DEGDME: Diethylene glycol dimethyl ether
DEGMBE: Diethylene glycol monobutyl ether
DEGDEE: Diethylene glycol diethyl ether

We claim:

1. A cleaning method for removing a rosin-base solder flux, the method comprising bringing a cleaning agent into contact with the flux on a substrate, the cleaning agent consisting of (A) at least one compound represented by the formula (1)

$$R^1O-(CH_2\overset{\overset{\displaystyle R^3}{|}}{C}HO)_k-R^2 \quad (1)$$

wherein $R^1$ is a hydrogen atom or an alkyl group having 1 to 5 carbon atoms, $R^2$ is an alkyl group having 1 to 5 carbon atoms, $R^3$ is a hydrogen atom or a methyl group and k is an integer of 2 to 4, (B) at least one non-ionic surfactant represented by the formula (2)

$$R^4-O-(CH_2CH_2O)_m-H \quad (2)$$

wherein $R^4$ is a straight- or branched-chain alkyl group having 6 to 20 carbon atoms, phenyl group or a phenyl group substituted with a straight- or atoms, n is an integer of 0 to 20 and X is a hydroxyl group or a group represented by the formula (4)

$$R^6O(CH_2CH_2O)_n- \quad (4)$$

wherein $R^6$ is a straight- or branched-chain alkyl group having 5 to 20 carbon atoms, phenyl group, or a phenyl group substituted with a straight- or branched-chain alkyl group having 7 to 12 carbon atoms and n is as defined above, or a salt thereof.

2. A cleaning method according to claim 1 wherein $R^4$ is a straight- or branched-chain alkyl group having 10 to 14 carbon atoms, phenyl group, or a phenyl group substituted with a straight- or branched-chain alkyl group having 7 to 12 carbon atoms and m is an integer of 3 to 16.

3. A cleaning method according to claim 1 wherein $R^5$ is a straight- or branched-chain alkyl group having 10 to 15 carbon atoms, n is an integer of 8 to 12 and X is a hydroxyl group or a group of the formula $R^6O(CH_2CH_2O)_n-$ wherein $R^6$ is a straight- or branched-chain alkyl group having 10 to 15 carbon atoms and n is an integer of 8 to 12.

4. A cleaning method according to claim 1 wherein the mixture consists of (A) about 10 to about 95 wt. % of the compound of the formula (1), (B) about 5 to 90 wt. % of the non-ionic surfactant of the formula (2), and (C) about 0.1 to about 90 wt. % of the phosphate anionic surfactant of the formula (3), the total of (A), (B) and (C) adding up to 100 wt. %.

5. A cleaning method according to claim 1 wherein the mixture consists of (A) about 50 to about 90 wt. % of the compound of the formula (1), (B) about 10 to 60 wt. % of the non-ionic surfactant of the formula (2), and (C) about 0.5 to about 60 wt. % of the phosphate anionic surfactant of the formula (3), the total of (A), (B) and (C) adding up to 100 wt. %.

6. A cleaning method for removing a rosin-base solder flux, the method comprising bringing s cleaning agent into contact with the flux on a substrate, the cleaning agent consisting of an aqueous solution of a mixture of (A) at least one compound represented by the formula (1)

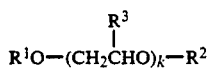

wherein $R^1$ is a hydrogen atom or an alkyl group having 1 to 5 carbon atoms, $R^2$ is an alkyl group having 1 to 5 carbon atoms, $R^3$ is a hydrogen atom or a methyl group and k is an integer of 2 to 4, (B) at least one nonionic surfactant represented by the formula (2)

$$R^4\!-\!O\!-\!(CH_2CH_2O)_m\!-\!H \quad (2)$$

wherein $R^4$ is a straight- or branched-chain alkyl group having 6 to 20 carbon atoms, phenyl group or a phenyl group substituted with a straight- or branched-chain alkyl group having 7 to 12 carbon atoms and m is an integer of 2 to 20, and (C) at least one phosphate anionic surfactant represented by the formula (3)

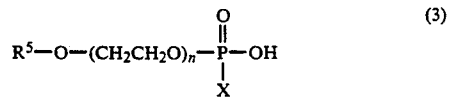

wherein $R^5$ is a straight- or branched-chain alkyl group having 5 to 20 carbon atoms, phenyl group, or a phenyl group substituted with a straight- or branched-chain alkyl group having 7 to 12 carbon atoms, n is an integer of 0 to 20 and X is a hydroxyl group or a group represented by the formula (4)

$$R^6O(CH_2CH_2O)_n\!- \quad (4)$$

wherein $R^6$ is a straight- or branched-chain alkyl group having 5 to 20 carbon atoms, phenyl group, or a phenyl group substituted with a straight- or branched-chain alkyl group having 7 to 12 carbon atoms and n is as defined above, or a salt thereof, wherein said aqueous solution contains said mixture at a concentration of about 10 wt. % or more but less than 100 wt. %.

7. A cleaning method according to claim 6 wherein $R^4$ is a straight- or branched-chain alkyl group having 10 to 14 carbon atoms, phenyl group, or a phenyl group substituted with a straight- or branched-chain alkyl group having 7 to 12 carbon atoms and m is an integer of 3 to 16.

8. A cleaning method according to claim 6 wherein $R^5$ is a straight- or branched-chain alkyl group having 10 to 15 carbon atoms, n is an integer of 8 to 12 and X is a hydroxyl group or a group of the formula $R^6O(CH_2CH_2O)_n\!-$ wherein $R^6$ is a straight- or branched-chain alkyl group having 10 to 15 carbon atoms and n is an integer of 8 to 12.

9. A cleaning method according to claim 6 wherein the mixture consists of (A) about 10 to about 95 wt. % of the compound of the formula (1), (B) about 5 to about 90 wt. % of the nonionic surfactant of the formula (2), and (C) about 0.1 to about 90 wt. % of the phosphate anionic surfactant of the formula (3), the total of (A), (B) and (C) adding up to 100 wt. %.

10. A cleaning method according to claim 6 wherein the mixture consists of (A) about 50 to about 90 wt. % of the compound of the formula (1), (B) about 10 to 60 wt. % of the nonionic surfactant of the formula (2), and (C) about 0.5 to about 60 wt. % of the phosphate anionic surfactant of the formula (3), the total of (A), (B) and (C) adding up to 100 wt. %.

* * * * *